United States Patent [19]

Pearce

[11] Patent Number: 5,567,978
[45] Date of Patent: Oct. 22, 1996

[54] HIGH VOLTAGE, JUNCTION ISOLATION SEMICONDUCTOR DEVICE HAVING DUAL CONDUCTIVITY TAPE BURIED REGIONS AND ITS PROCESS OF MANUFACTURE

[75] Inventor: Lawrence G. Pearce, Palm Bay, Fla.

[73] Assignee: Harris Corporation, Melbourne, Fla.

[21] Appl. No.: 383,261

[22] Filed: Feb. 3, 1995

[51] Int. Cl.$^6$ ..................................... H01L 29/00
[52] U.S. Cl. ................... 257/550; 257/545; 257/546; 257/547; 257/552
[58] Field of Search .................. 57/545, 546, 547, 57/550, 552

[56] References Cited

U.S. PATENT DOCUMENTS

| | | | |
|---|---|---|---|
| 4,249,970 | 2/1981 | Briska et al. | 257/552 |
| 4,811,071 | 3/1987 | Roloff | 257/552 |
| 5,406,112 | 4/1995 | Sakane | 257/552 |

*Primary Examiner*—Ngân V. Ngô
*Attorney, Agent, or Firm*—Charles E. Wands

[57] ABSTRACT

A two masking level process for a dual buried region epitaxial architecture forms a first masking layer on a surface of a P type substrate. The first masking layer exposes first and second surface portions of the substrate for N+ and P+ buried regions. N type impurities are introduced into the substrate through the first masking layer, so as to form N+ doped regions. A second masking layer is then selectively formed on the first masking layer, such that the second masking layer masks the first aperture, but exposes a second portion of the first masking layer that both includes and surrounds the second aperture. Boron impurities are then introduced through the exposed second aperture of the first masking layer, to a P+ doping concentration. That portion of the first masking layer surrounding the second aperture is removed, and boron impurities are then introduced into exposed second and third surface portions of the substrate, thereby forming a third buried region of the second conductivity type that is adjacent to the second doped region. The composite mask is removed from the substrate, and an N type layer is grown. Due to differences in diffusion coefficients, the P dopant (boron) in the second and third buried regions outruns the N dopant in the second buried region, resulting in the formation of an N+ buried region that is encapsulated in a P+ buried region. The P+ buried region is, in turn, laterally surrounded by a P-type buried region, so as to provide the desired compensation of N ions that are autodoped from the first N+ buried region in the epitaxial layer.

5 Claims, 5 Drawing Sheets

HIGH VOLTAGE, JUNCTION ISOLATION SEMICONDUCTOR DEVICE HAVING DUAL CONDUCTIVITY TAPE BURIED REGIONS AND ITS PROCESS OF MANUFACTURE

FIELD OF THE INVENTION

The present invention relates in general to the manufacture of integrated circuits and is particularly directed to a new and improved reduced mask set process for manufacturing a high voltage, junction isolation semiconductor device formed in an epitaxial layer having dual conductivity type buried regions at its interface with an underlying substrate.

BACKGROUND OF THE INVENTION

Many integrated circuit architectures employ one or more buried regions or layers, typically located along an interface between an upper (epitaxially formed) semiconductor layer in which a variety of device regions are formed. For example, in the case of a junction isolation architecture, such as that diagrammatically illustrated in FIG. 1, an N type epitaxial layer 11 may be formed atop an underlying P type semiconductor substrate 13. Prior to formation of the epitaxial layer 11, respective N+ and P+ type (high impurity concentration) regions 15 and 17 are formed in spaced apart surface portions of the top surface 19 of the P type substrate 13. In such an architecture, the N+ buried region 15 is usually employed as a low resistance path to a bottom, N type terminal (not shown) of a vertical device, such as the collector of a vertical NPN bipolar transistor, or the drain of a vertical DMOSFET device. The P+ buried region 17 is customarily used to provide lateral isolation, by extending the substrate doping type up into the epitaxial layer 11. In some processes, the P+ buried region 17 may also provide the same buried region functionality as the N+ buried region 15, for example, serving as the collector of a vertical PNP bipolar transistor.

In processes that are intended to provide very low buried N+ region resistance over a large area, while also maintaining a high breakdown voltage, the use of an epitaxial process to form the topside layer 11 may constitute a severe restraint due to autodoping from the underlying N+ region 15 into the epitaxial layer 11, as the epitaxial layer is being formed. This undesirable autodoping phenomenon is illustrated in FIG. 2, which illustrates the impurity concentration profile of the resulting device along section line 18 in FIG. 1 of the dual buried region architecture of FIG. 1 resulting from autodoping. During the initial phase of the epitaxial process, N type impurities outdope from the N+ buried region 15 and are incorporated ubiquitously into the growing epitaxial layer 11. This intrusion of N type dopant can create a large, unwanted N-type doping contaminant throughout the bottom or substrate-interface portion of the epitaxial layer, so that the N-type autodoped material forms a junction with the P+ buried region 17. This junction will necessarily have the lowest breakdown voltage, and can limit the intended performance of the device.

One way to mitigate the effects of such autodoping is to provide a source of P type doping to compensate for the N type outdoping. Unfortunately, the large difference in diffusion coefficients between a typical P type dopant, such as boron, and an N type dopant, such as arsenic or antimony (preferred species for the formation of an N+ buried region), can mean that such a compensation approach is ineffective as an unmasked layer.

More particularly, if the P type dopant (boron) is able to successfully compensate the peak of the N type autodoping, it is likely to extend well beyond the autodoped N profile in the vertical direction, thereby producing an unwanted P type peak, both above and below the autodoping, as diagrammatically illustrated in FIG. 3. This P type peak will interact with the N+ buried region 15 in the same way that the N type autodoping does with the P+ buried region 17. It will be readily appreciated, therefore, that using unpatterned P type compensation does not solve the problem; it merely moves it from the P+ buried region 17 to the N+ buried region 15.

One solution would be to add a masking level and make the P type compensation material a P type buried region, with the mask placing the P type compensation only around the P+ buried region 17 and preventing it from reaching the N+ buried region 15. It goes without saying, however, that the addition of a masking level undesirably increases processing complexity and cost.

SUMMARY OF THE INVENTION

In accordance with the present invention, the above described problem is solved by taking advantage of the diffusion coefficient differential between P and N type dopants, which enables an additional P-type buffer region to be formed in the epitaxial layer along with the N+ and P+ buried regions, without increasing the number of mask levels used to form the dual buried regions.

For this purpose, a first masking layer (e.g. an oxide layer) is initially formed on the epitaxial growth surface of a (P type) semiconductor (e.g. silicon) substrate, so that the first masking layer exposes first and second surface portions of the semiconductor substrate where the N+ and P+ buried regions are to be formed. Next, impurities of a first conductivity type (e.g. arsenic or antimony N type impurities) are introduced into the growth surface of the substrate through the first and second apertures of the first masking layer, so as to form first and second N+ doped (buried) regions in the first and second surface portions of the substrate.

A second masking layer, such as a layer of photoresist, is then selectively formed on the first masking layer, such that the second masking layer masks that portion of the first masking layer which includes the first aperture, but exposes a second portion of the first masking layer that both includes and surrounds the second aperture. Second conductivity type impurities (e.g. P type boron impurities) are then introduced through the exposed second aperture of the first masking layer, to a P+ doping concentration, which modifies the doping composition of the second doped region in the second surface portion of the substrate to a composite doping containing both N+ impurities and P+ impurities. The density of boron dopants in the second surface portion of the substrate may be considerably less than that of the N type dopants, for example one-tenth the total doping of the N+ dopant. However, because of the substantial diffusion coefficient differential between boron and antimony or arsenic in the single crystalline material of the silicon substrate and that of the epitaxial silicon layer to be grown on the substrate, the boron will diffuse beyond the extent of diffusion of the antimony during the growth of the epitaxial layer.

Following the introduction of boron impurities into the second surface portion of the substrate through the exposed second aperture of the first masking layer, that portion of the first masking layer surrounding the second aperture and exposed by the second masking layer is removed, so as to create a third aperture through the composite structure of the first and second masks which, exposes both the second surface portion of the substrate (containing both P+ and N+ impurities) and a third surface portion of the substrate which is adjacent to and surrounds the second surface portion of the substrate. Boron impurities are then introduced through the third mask aperture into the exposed second and third surface portions of the substrate, thereby forming a third buried region of the second conductivity type that is adjacent to the second doped region. The composite doping profile of the dual second and third buried is such that a P-type region surrounds the composite P+ and N+ second region.

The composite mask layer structure is then removed from the surface of the substrate, so as to expose each of the first, second and third buried regions. Then, an N type epitaxial semiconductor layer is grown on the exposed surface of the substrate. During the epitaxial growth and any subsequent thermal processing, the P and N type impurities in each of the first, second and third buried regions are outdoped from the surface substrate into the epitaxial layer. Because of the differences in diffusion coefficients, the P dopant (boron) in the second and third buried regions outruns the N dopant in the second buried region, resulting in the formation of an N+ buried region that is encapsulated in a P+ buried region. The P+ buried region is, in turn, laterally surrounded by a P-type buried region, so as to provide the desired compensation of N type impurities that are autodoped from the first N+ buried region in the epitaxial layer.

In order to provide a conductive path from the top surface of the epitaxial layer to the first N+ buried region, N+ impurities are selectively introduced into the epitaxial layer to form a fourth semiconductor region which extends from the top surface of the epitaxial layer down to the first N+ buried region. Similarly, to provide sidewall junction isolation continuity from the top surface of the epitaxial layer to the second P+ buried region, P+ impurities are selectively introduced into the epitaxial layer to form a fifth semiconductor region which extends from the top surface of the epitaxial layer down to the outdoped P+ buried region.

BRIEF DESCRIPTION OF THE DRAWINGS

FIG. 5 is an impurity distribution profile along section line 99 of the epitaxially grown semiconductor architecture of FIG. 4I.

DETAILED DESCRIPTION

As described briefly above, pursuant to the processing methodology of the present invention, advantage is taken of the diffusion coefficient differential between P and N type dopants, to enable an additional, autodoping-compensating P-type buffer region to be formed in the epitaxial layer along with the N+ and P+ buried regions, without increasing the number of masks used to form the dual buried regions. Attention is directed to FIGS. 4A–4J, which are diagrammatic sectional views of a junction isolation semiconductor architecture at respective steps of its manufacture in accordance with the dual mask set processing sequence of the present invention.

In the following description, the dual buried region, junction isolation architecture is one having a P type substrate upon which an N-type epitaxial layer is grown. The problem being addressed is the ubiquitous autodoping of N type impurities from the buried N+ region into that portion of the epitaxial layer intersecting the outdoped P+ buried region. As described briefly above, the higher diffusion coefficient of boron (a P type dopant) in single crystalline silicon, relative to that of antimony or arsenic (N type dopants) allows the boron to outrun the latter during elevated temperature processes (epitaxial growth from the silicon substrate or subsequent processing). It should be observed, however, that the invention is not limited to the example described here. The impurity types of the architecture may be reversed, so long as the dopants chosen posses a similarly reversed diffusion coefficient differential.

Figure 4:
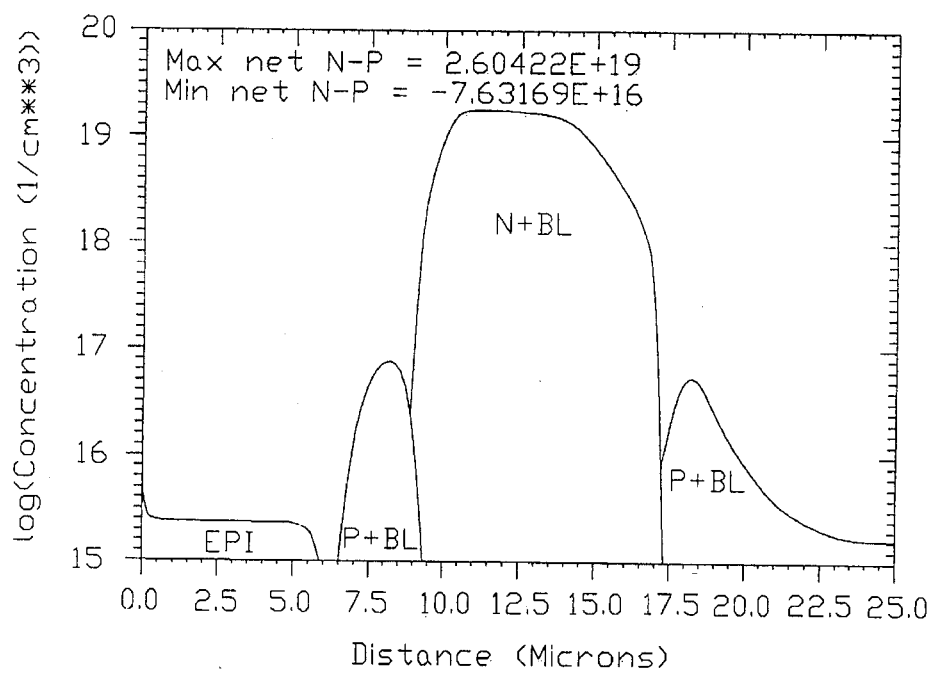
FIGS. 4A–4J are diagrammatic sectional views of a junction isolation semiconductor architecture at respective steps of its manufacture in accordance with the dual mask set processing sequence of the present invention.
Figure 4A:
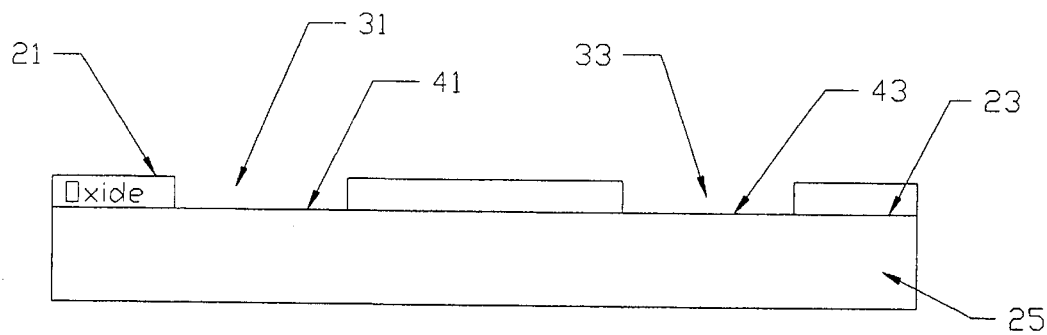

Referring now to FIG. 4A, a first masking layer (e.g. an oxide layer) 21 is initially formed on the epitaxial growth surface 23 of a (P type) semiconductor (e.g. silicon) substrate 25, for example by non-selectively forming a layer of oxide, masking the oxide with an oxide-etch mask (e.g. photoresist), and etching the oxide layer 21 through the patterned photoresist layer to form first and second apertures 31, 33 through the oxide mask 21, exposing first and second surface portions 41, 43 of the semiconductor substrate 25, where N+ and P+ (buried) regions are to be formed.

Figure 4B:
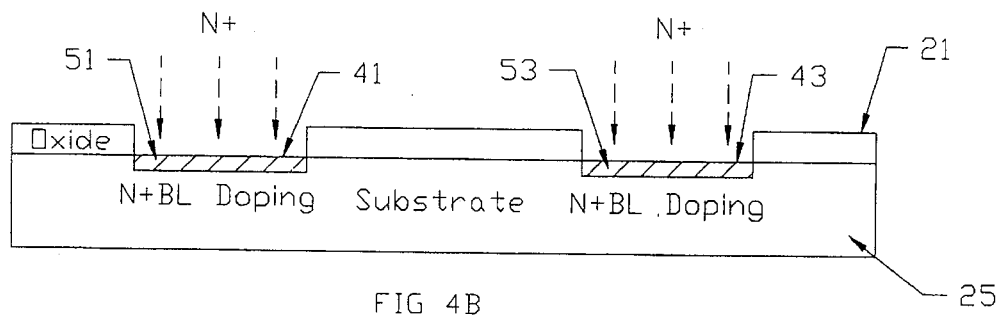

Next, as shown in FIG. 4B, impurities of a first conductivity type (e.g. arsenic or antimony N type impurities) are introduced (e.g., by ion implantation) through the first and second apertures 31 and 33 of the first masking layer 21, so as to form first and second N+ doped (buried) regions 51, 53 in the first and second surface portions 41, 43, respectively, of the substrate 25. Where the N+ doped region 51 is to be employed as a low resistance subcollector region of a bipolar structure in a junction isolation architecture, the geometry profile of aperture 33 may surround aperture 31. Such profile is not shown in FIGS. 4A–4J, in order to reduce the complexity of the drawings.

Figure 4C:
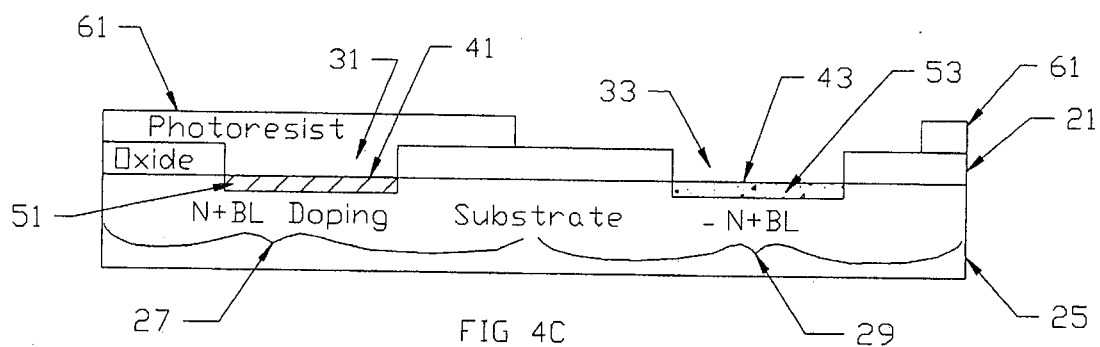

Following the introduction of the N+ dopant through mask 21, a second masking layer 61, such as a layer of photoresist, is selectively formed on the first masking oxide layer 21, as shown in FIG. 4C, such that the second masking layer 61 masks that portion 27 of the first masking layer 21 that contains its first aperture 31, but exposes a second portion 29 of the oxide layer 21, that both includes and surrounds its second aperture 33.

Figure 4D:
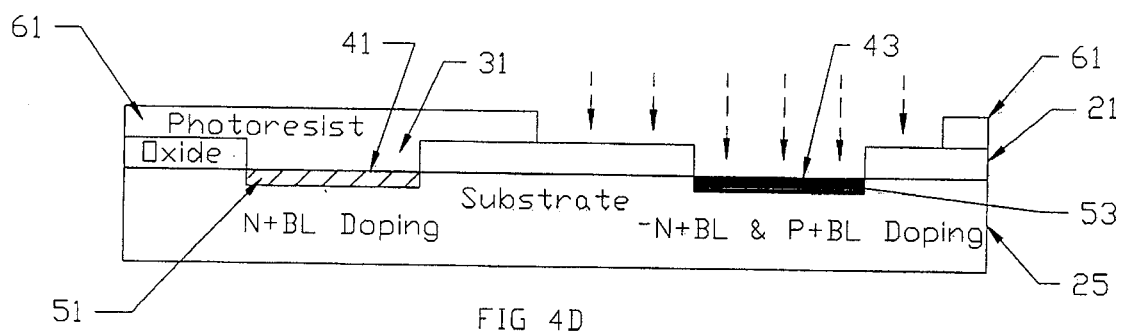

Next, as shown in FIG. 4D, second conductivity type impurities (e.g. P type boron impurities) are introduced (ion implanted) through the exposed second aperture 29 of the oxide layer 21, to form a prescribed density of P+ doping concentration in the second region 53. This P+ dopant introduction functions to modify the overall doping composition of the second doped region 53, so that it has both N+ impurities and P+ impurities. The density of the boron dopants in the second region 53 may be considerably less than that of the N type dopant introduced through the first and second apertures in the first mask, for example one-tenth the total doping of the N+ dopant. However, as noted briefly above, because of the substantial diffusion coefficient differential between boron and antimony or arsenic in the single crystalline material of the silicon substrate 25 and that of the epitaxial silicon layer that will be grown on the substrate, the boron will outrun and diffuse beyond the extent of diffusion of antimony or arsenic during the growth of the epitaxial layer.

Figure 4E:
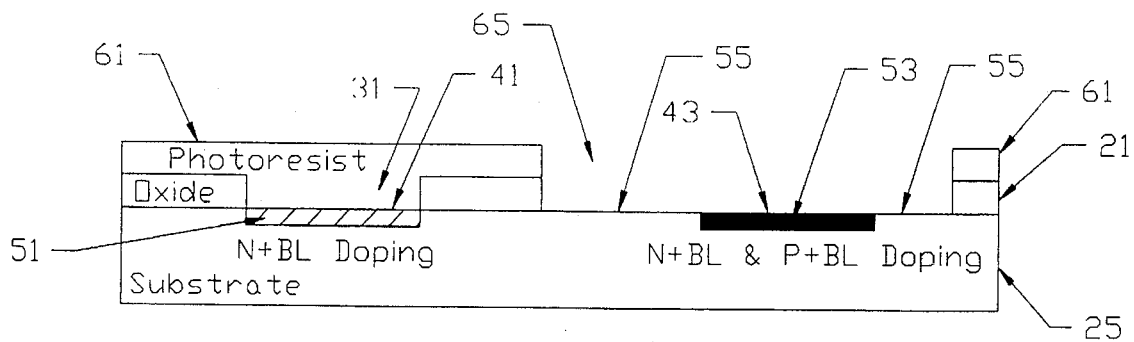

Following the introduction of boron impurities into the second surface portion 43 of the substrate 25 through the exposed second aperture 33 of the first masking layer 21, the portion 29 of the first masking layer 21 surrounding the second aperture 33 and exposed by the second masking layer 61 is removed, as shown in FIG. 4E, so as to create a third aperture 65 through the composite structure of the first and second masks. This third aperture 65 exposes both the second surface portion 43 of the substrate (containing both P+ and N+ impurities) and a third surface portion 55 of the substrate 25 which is adjacent to and surrounds the second surface portion 43 of the substrate.

Figure 4F:
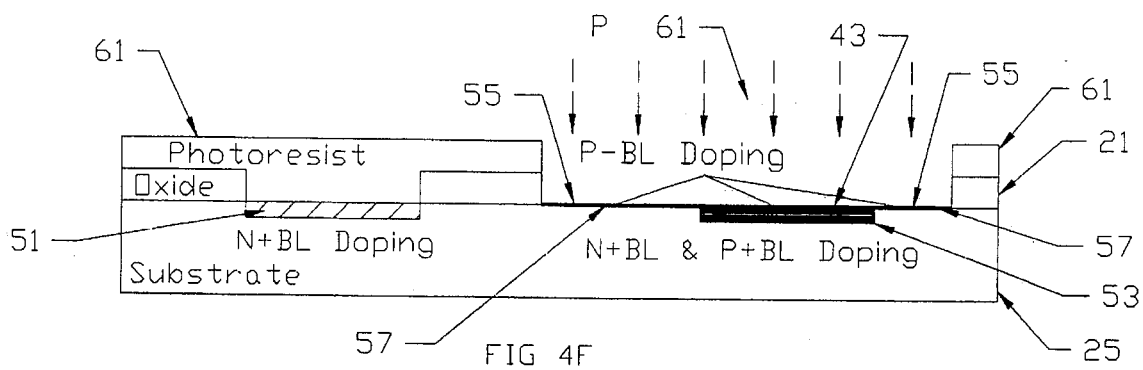

Next, as shown in FIG. 4F, boron impurities are introduced through the third mask aperture 65 into the exposed second and third surface portions 43 and 55, respectively, of the substrate 25, thereby forming a third buried region 57 of the second conductivity type that is adjacent to the second doped region 53. The composite surface doping profile of the dual second and third regions 53, 57 is such that a P-type region 57 surrounds the composite P+ and N+ second region 53.

Figure 4G:
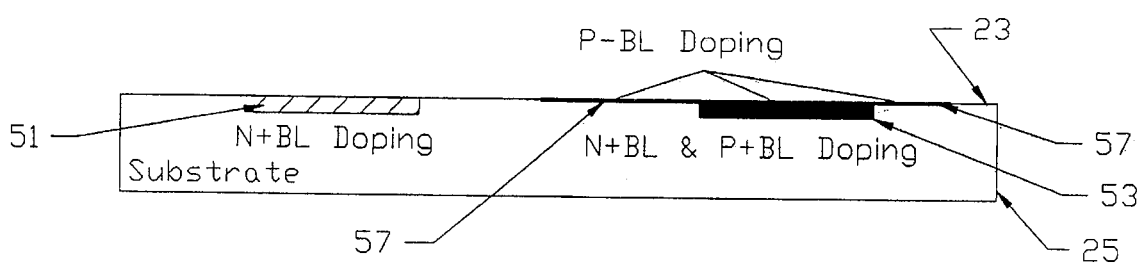
Figure 4H:
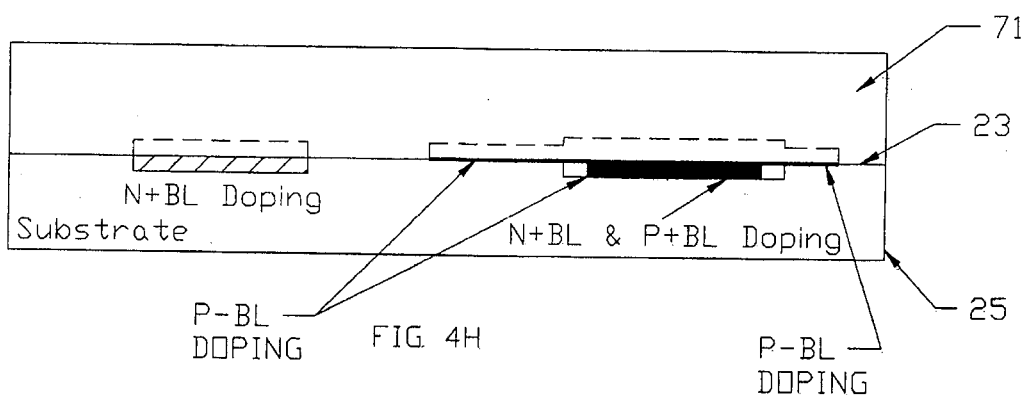

As illustrated in FIG. 4G, the composite mask is then removed from the surface 23 of the substrate 25, so as to expose each of the first N+ region 51, the second N+/P+ region 53 and the third P-type region 57, and an N type semiconductor layer 71 is epitaxially grown on the exposed surface of the substrate, as shown in FIG. 4H. During the epitaxial growth of layer 71 and any subsequent thermal processing, the P and N type impurities in each of the first, second and third buried regions will be outdoped substrate into the epitaxial layer. However, because of the differences in diffusion coefficients, the P dopant (boron) in the second and third buried regions 53 and 57, respectively, diffuse beyond the N+ dopant being autodoped from the second buried region 53.

Figure 1:
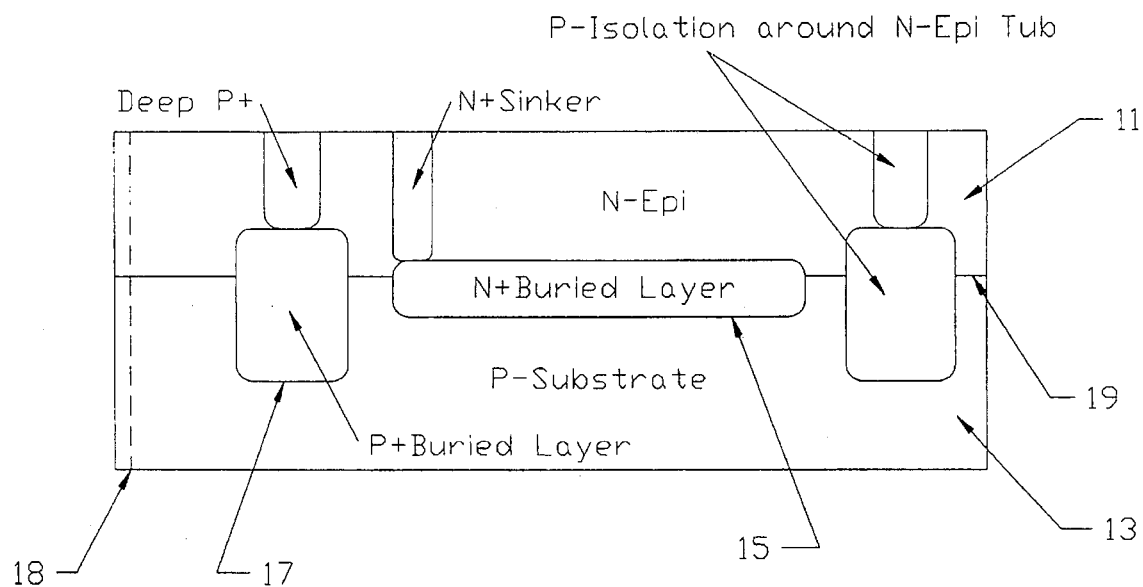
FIG. 1 diagrammatically illustrates a side sectional view of a junction isolation architecture in which an N type epitaxial layer is formed atop an underlying P type semiconductor substrate, and contains dual N+ and P+ type buried regions.
Figure 2:
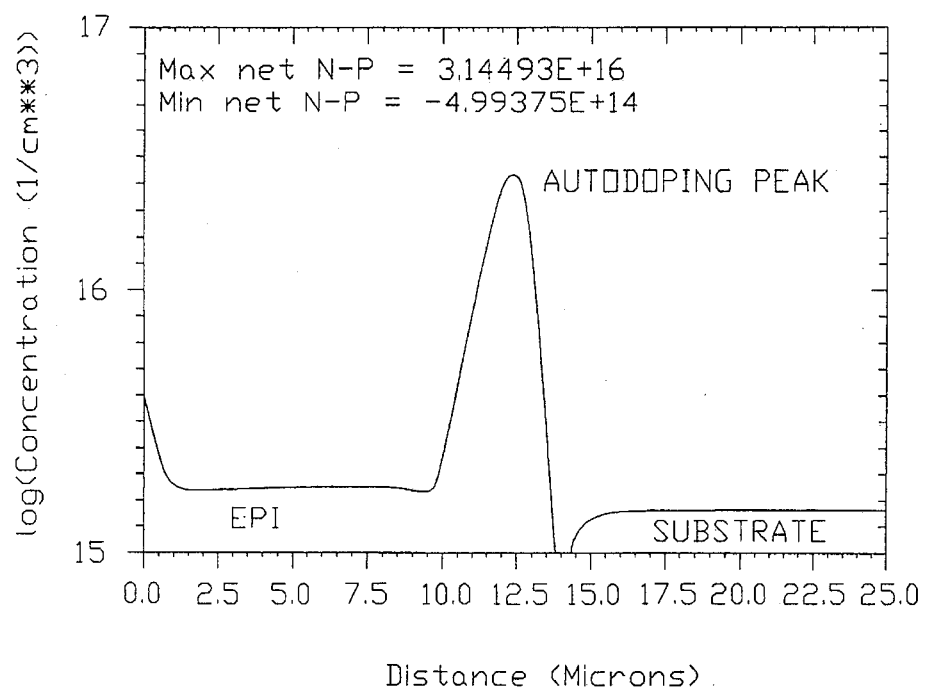
FIG. 2 illustrates the impurity concentration profile along section line 18 in FIG. 1 of the dual buried region architecture of FIG. 1 resulting from autodoping.
Figure 3:
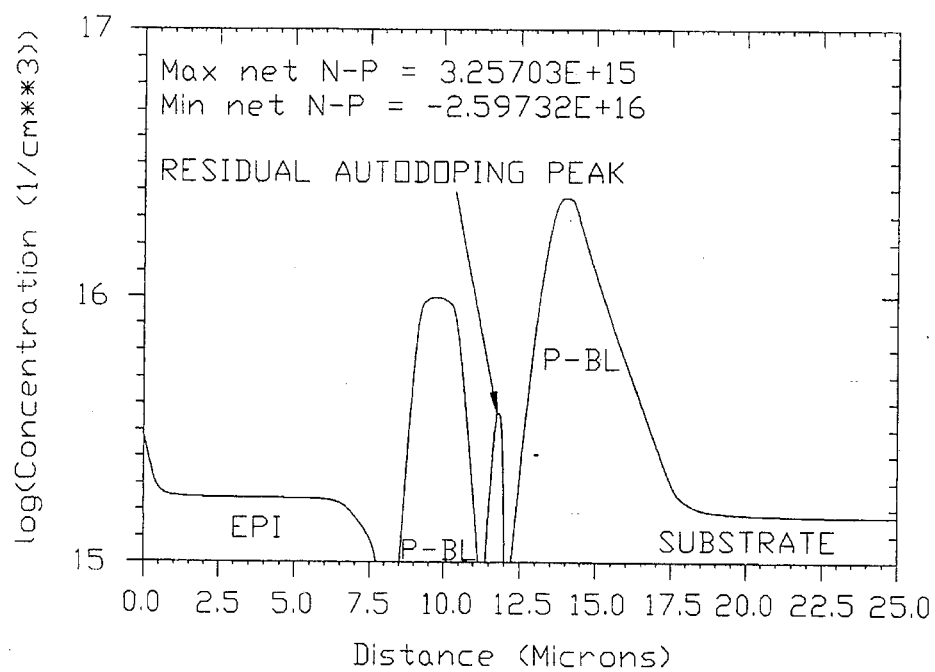
FIG. 3 is an impurity distribution profile of an epitaxially grown semiconductor architecture having a P type peak, both above and below autodoping from an underlying substrate.
Figure 4I:
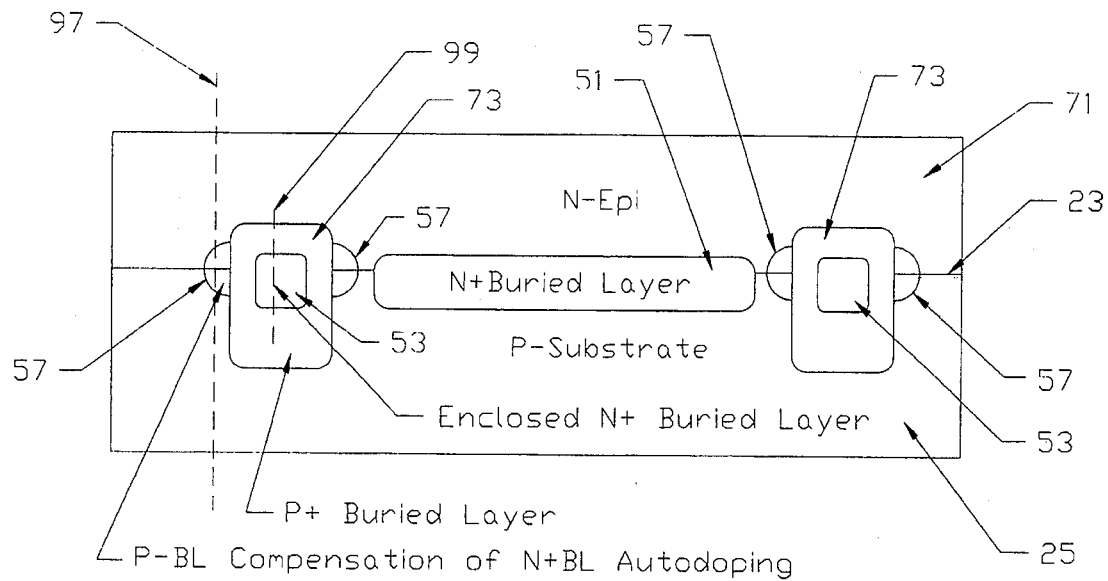

As shown in FIG. 4I, what results is a structure in which the N+ buried region 53 is encapsulated in a P+ buried region 73. The P+ buried region 73 is, in turn, laterally surrounded by P-type buried region 57. The associated doping profile along section line 97 of this buried region structure is shown in FIG. 3 as providing the desired P type compensation of N type impurities that are autodoped from the first N+ buried region 51 into the interface of the epitaxial layer 71 with the top surface 23 of substrate 25. FIG. 5 shows the doping profile along section line 99 as providing the desired encapsulation of the N+ buried region 53 within the outdiffused P+ buried region 73.

Figure 4J:
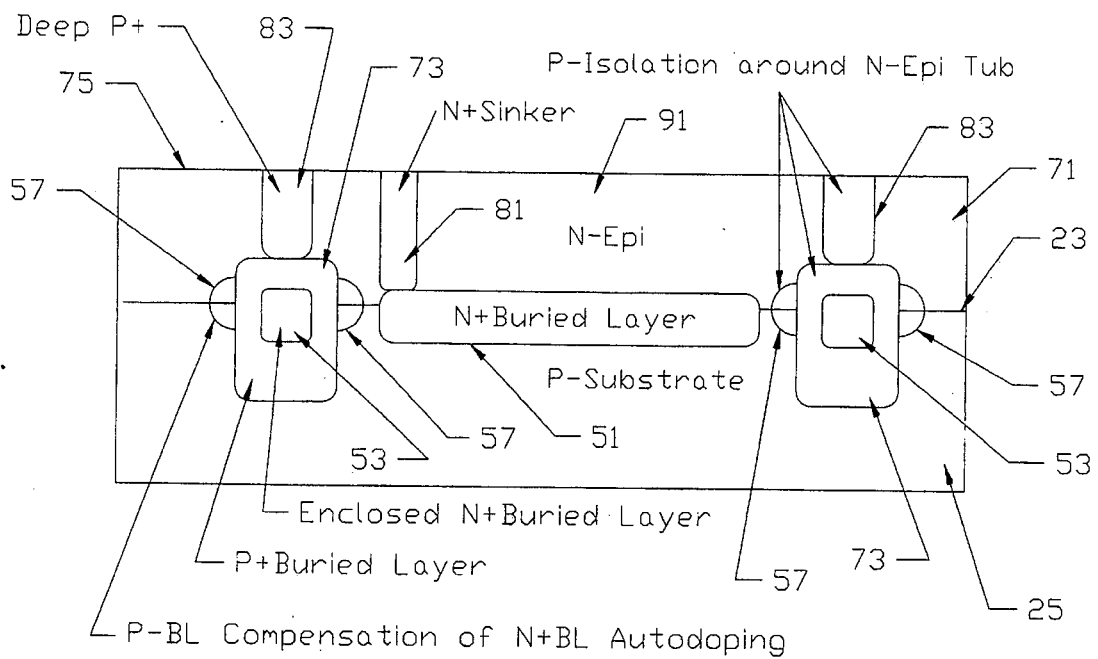

As illustrated in FIG. 4J, to provide a conductive path to the first N+ buried region 51, N+ impurities are selectively introduced into the epitaxial layer 71, thereby forming a fourth semiconductor region 81, which extends from the top surface 75 of the epitaxial layer 71 down to the first N+ buried region 51. To provide sidewall junction isolation continuity from the top surface of the epitaxial layer to the second P+ buried region, P+ impurities are selectively introduced into the epitaxial layer to form a fifth semiconductor region 83 which extends from the top surface of the epitaxial layer down to the outdoped P+ buried region 73, and forms a junction-isolated island 91 in epitaxial layer 71 in which one or more device regions are formed.

As will be appreciated from the foregoing description, the processing methodology of the present invention takes advantage of the diffusion coefficient differential between P and N type dopants, so as to enable an additional P-type buffer region to be formed in the epitaxial layer along with the N+ and P+ buried regions, without increasing the number of mask levels used to form the dual buried regions. Through a two level masking sequence, three buried regions are formed in the surface of the substrate, so that, during epitaxial growth, P and N type impurities in each of the first, second and third buried regions are outdoped from the surface substrate into the epitaxial layer. Because of the differences in diffusion coefficients, the P dopant in the second and third buried regions outruns the N dopant in the second buried region, resulting in the formation of an N+ buried region that is encapsulated in a P+ buried region. The P+ buried region is, in turn, laterally surrounded by a P-type buried region, so as to provide the desired compensation of N ions that are autodoped from the first N+ buried region in the epitaxial layer.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:
   a semiconductor substrate of a first conductivity type having a first surface;
   a semiconductor layer of a second conductivity type formed on said first surface said semiconductor substrate and forming a first PN junction at an interface therewith;
   a first semiconductor region of said second conductivity type and having an impurity concentration greater than of said semiconductor layer, buried in said semiconductor layer at a first portion of said interface;
   a second semiconductor region of said second conductivity type and having an impurity concentration greater than of said semiconductor layer, buried in said semiconductor layer at a second portion of said interface spaced apart from said first portion of said interface;
   a third semiconductor region of said first conductivity type and having a first impurity concentration and encapsulating said second semiconductor region; and
   a fourth semiconductor region of said first conductivity type and having a second impurity concentration less than said first impurity concentration, and extending from said third semiconductor region at said interface.

2. A semiconductor device according to claim 1, further including a fifth semiconductor region of said second conductivity type, which extends from a top surface of said semiconductor layer down to said first semiconductor region, and a sixth semiconductor region of said first conductivity type which extends from said top surface of said semiconductor layer down to said third semiconductor region.

3. A semiconductor device according to claim 1, wherein said first conductivity type is P type and said second conductivity type is N type.

4. A semiconductor device comprising:

a P type semiconductor substrate having a first surface;

an N type semiconductor layer epitaxially grown on said first surface semiconductor substrate and forming a first PN junction at an interface therewith;

a first, N+type semiconductor buried region, buried in said semiconductor layer and said substrate at a first portion of said interface;

a second, N+type semiconductor buried region, buried in said semiconductor layer and said substrate at a second portion of said interface, spaced apart from said first portion of said interface;

a third, P-type semiconductor buried region, buried in said semiconductor layer and said substrate at a third portion of said interface, surrounding said second, N+type semiconductor buried region; and a fourth, P-type semiconductor buried region, buried in said semiconductor layer and said substrate at a fourth portion of said interface, and extending from said third, N+ semiconductor buried region at said interface.

5. A semiconductor device according to claim 4, further including fifth, N+ semiconductor region, which extends from a top surface of said semiconductor layer down to and intersects said first, N+ semiconductor buried region, and a sixth, P+ semiconductor region which extends from said top surface of said semiconductor layer down to and intersects said third, P+ semiconductor region.

* * * * *